(12) United States Patent
Li et al.

(10) Patent No.: US 10,319,583 B2
(45) Date of Patent: Jun. 11, 2019

(54) SELECTIVE DEPOSITION OF SILICON NITRIDE FILMS FOR SPACER APPLICATIONS

(71) Applicant: Applied Materials, Inc., Santa Clara, CA (US)

(72) Inventors: Ning Li, San Jose, CA (US); Mihaela Balseanu, Sunnyvale, CA (US); Li-Qun Xia, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/455,744

(22) Filed: Mar. 10, 2017

(65) Prior Publication Data

US 2017/0263437 A1    Sep. 14, 2017

Related U.S. Application Data

(60) Provisional application No. 62/307,537, filed on Mar. 13, 2016.

(51) Int. Cl.
| | |
|---|---|
| *H01L 21/02* | (2006.01) |
| *H01L 21/311* | (2006.01) |
| *C23C 16/04* | (2006.01) |
| *C23C 16/34* | (2006.01) |
| *C23C 16/455* | (2006.01) |
| *C23C 16/56* | (2006.01) |
| *H01L 21/3105* | (2006.01) |

(52) U.S. Cl.
CPC ........ *H01L 21/0217* (2013.01); *C23C 16/045* (2013.01); *C23C 16/345* (2013.01); *C23C 16/45519* (2013.01); *C23C 16/45536* (2013.01); *C23C 16/45551* (2013.01); *C23C 16/56* (2013.01); *H01L 21/0228* (2013.01); *H01L 21/0234* (2013.01); *H01L 21/02211* (2013.01); *H01L 21/02219* (2013.01); *H01L 21/02274* (2013.01); *H01L 21/3105* (2013.01); *H01L 21/31111* (2013.01)

(58) Field of Classification Search
None
See application file for complete search history.

(56) References Cited

U.S. PATENT DOCUMENTS

| | | | | |
|---|---|---|---|---|
| 8,871,651 | B1* | 10/2014 | Choi | ................. H01L 29/66795 216/12 |
| 2012/0028454 | A1* | 2/2012 | Swaminathan | ....... C23C 16/045 438/558 |
| 2014/0023794 | A1 | 1/2014 | Mahajani et al. | |
| 2014/0183661 | A1* | 7/2014 | Lin | ................. H01L 21/823431 257/401 |

(Continued)

OTHER PUBLICATIONS

PCT International Search Report and Written Opinion in PCT/US2017/021852 dated Jun. 20, 2017, 11 pages.

(Continued)

*Primary Examiner* — Shamim Ahmed
(74) *Attorney, Agent, or Firm* — Servilla Whitney LLC

(57) ABSTRACT

Methods for forming a spacer comprising depositing a film on the top, bottom and sidewalls of a feature and treating the film to change a property of the film on the top and bottom of the feature so that the film can be selectively etched from the top and bottom of the feature relative to the film on the sidewalls of the feature.

18 Claims, 6 Drawing Sheets

(56) References Cited

U.S. PATENT DOCUMENTS

| | | | |
|---|---|---|---|
| 2014/0273528 A1* | 9/2014 | Niskanen | C23C 16/345 |
| | | | 438/792 |
| 2014/0273530 A1* | 9/2014 | Nguyen | H01L 21/0217 |
| | | | 438/792 |
| 2015/0099360 A1* | 4/2015 | Yieh | H01L 21/823462 |
| | | | 438/690 |
| 2015/0099375 A1* | 4/2015 | Haripin | C23C 14/027 |
| | | | 438/793 |
| 2015/0126042 A1* | 5/2015 | Pasquale | H01L 21/02274 |
| | | | 438/761 |
| 2015/0162185 A1 | 6/2015 | Pore | |
| 2015/0200110 A1 | 7/2015 | Li et al. | |
| 2016/0068953 A1 | 3/2016 | Li et al. | |
| 2017/0263438 A1* | 9/2017 | Li | H01L 21/02211 |

OTHER PUBLICATIONS

PCT IPRP & Written Opinion in PCT/US2017/021852, dated Sep. 27, 2018, 8 pgs.

\* cited by examiner

SELECTIVE DEPOSITION OF SILICON NITRIDE FILMS FOR SPACER APPLICATIONS

CROSS-REFERENCE TO RELATED APPLICATIONS

This application claims priority to U.S. Provisional Application No. 62/307,537, filed Mar. 13, 2016, the entire disclosure of which is hereby incorporated by reference herein.

TECHNICAL FIELD

The present disclosure relates generally to methods of depositing thin films. In particular, the disclosure relates to processes for the selective deposition of silicon nitride films by spatial ALD.

BACKGROUND

Silicon nitride thin films as a dielectric layer have been widely used in semiconductor fabrication processes. For example, SiN films are used in multi-patterning processes as spacer materials to achieve smaller device dimensions without employing the most expensive EUV lithography technology. Additionally, SiN can be used as a gate spacer material to isolate gate structure and contact areas to minimize potential leakage current.

Traditional silicon nitride spacer fabrication processes include conformal SiN film deposition on 3D structures (e.g., fins) followed by directional plasma dry etching to remove the top and bottom layer while keeping the sidewall film as a spacer. However, it has been found that the dry etch process could insidiously damage the sidewall surface and change the film properties; eventually affective device performance and yield.

Therefore, there is a need in the art for processes of depositing a selective spacer films.

SUMMARY

One or more embodiments of the disclosure are directed to processing methods. A substrate surface having at least one feature thereon is provided. The at least one feature comprises a top, a bottom and a sidewall. A film is formed on the at least one feature so that the film is formed on the top, bottom and sidewall. The film is treated with a plasma to change a property of the film on the top and bottom of the feature so that the top and bottom of the feature have higher wet etch rates than the film on the sidewall.

Additional embodiments of the disclosure are directed to processing methods comprising positioning a substrate surface in a processing chamber. The substrate surface has at least one feature thereon. The at least one feature has a top, bottom and sidewalls. The substrate surface is exposed to a deposition environment comprising at least one deposition cycle. The deposition cycle comprises sequential exposure to a silicon precursor and a nitrogen containing reactant to form a silicon nitride film on the top, bottom and sidewalls of the at least one feature. The silicon nitride film is exposed to a treatment environment to modify the silicon nitride film deposited on the top and bottom of the at least one feature so that the film on the top and bottom have a higher wet etch rate than the film on the sidewalls. The treatment environment comprises a plasma having a high ion concentration.

Further embodiments of the disclosure are directed to processing methods comprising placing a substrate having a substrate surface with a feature into a processing chamber comprising a plurality of process regions. Each process region is separated from adjacent process regions by a gas curtain. The feature comprises a top, a bottom and a sidewall. At least a portion of the substrate surface is exposed to a first process condition in a first process region of the processing chamber. The first process condition comprises a silicon precursor. The substrate surface is laterally moved through a gas curtain to a second process region of the processing chamber. The substrate surface is exposed to a second process condition in the second process region of the processing chamber. The second process condition comprises a nitrogen precursor. The substrate surface is laterally moved through a gas curtain to a third process region of the processing chamber. The substrate surface is exposed to a third process condition in the third process region of the processing chamber. The third process condition comprises a nitrogen reactant to form a silicon nitride film on the top, bottom and sidewalls of the feature. Exposure to the first process condition, the second process condition and the third condition is repeated to form a silicon nitride film with a predetermined thickness. The substrate surface is moved to a fourth process region of the processing chamber. The fourth process region comprises a treatment environment comprising a high ion concentration plasma that selectively decreases the wet etch rate of the silicon nitride film on the top and bottom of the feature.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
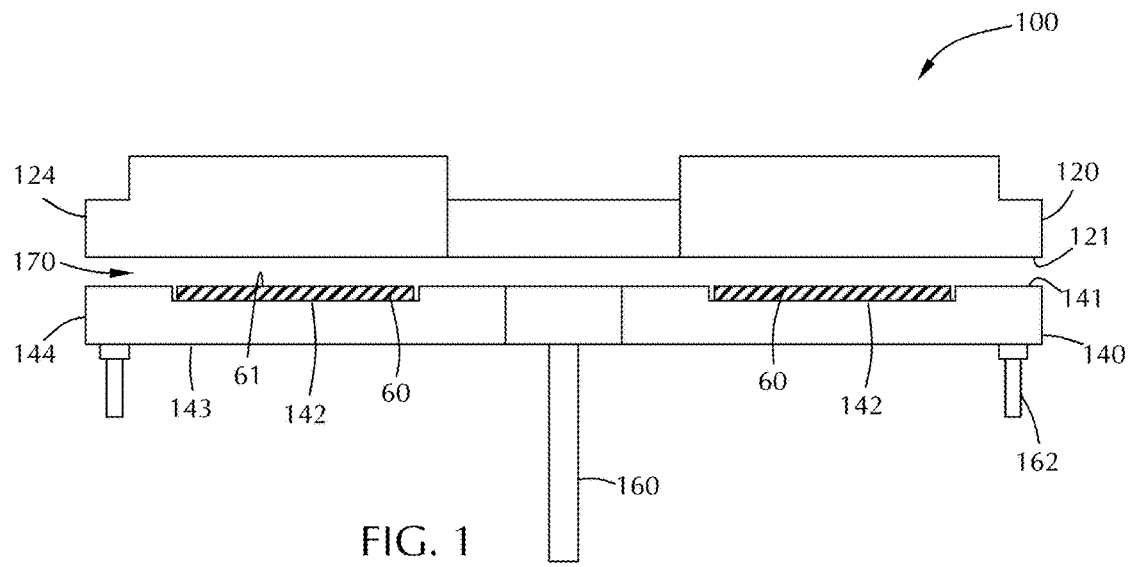
FIG. 1 shows a cross-sectional view of a batch processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Some embodiments of the disclosure are directed to processes that use a reaction chamber with multiple gas inlet channels that can be used for introduction of different chemicals or plasma gases. Spatially, these channels are separated by inert purging gases and/or vacuum pumping holes to create a gas curtain that minimizes or eliminates mixing of gases from different channels to avoid unwanted gas phase reactions. Wafers moving through these different spatially separated channels get sequential and multiple surface exposures to different chemical or plasma environment so that layer by layer film growth in spatial ALD mode or surface etching process occur. In some embodiments, the processing chamber has modular architectures on gas distribution components and each modular component has independent parameter control (e.g., RF or gas flow) to provide flexibility to control, for example, gas flow and/or RF exposure.

Some embodiments of the disclosure use spatial architectures and comprise a first chemistry dosing on a substrate surface followed by a second chemical exposure to react with the dosed chemistry to form a film, followed by a third additional post treatment process. In use, embodiments of the disclosure have an ALD layer that can be exposed to in-situ post treatment. In some embodiments, the treatment is done once. In some embodiments, the treatment may be employed every cycle. The minimum amount of treatment might be in the range of every 1 to 100 deposition cycles or more.

Some embodiments of the disclosure are directed to selective SiN deposition methods that allow for different film properties based on the deposition location on a 3D structure. For example, a film deposited on the top and bottom of a structure can be treated to have different film properties than a film deposited on the sidewall of the structure. Some embodiments of the disclosure advantageously provide methods of forming a film in which wet etching can selectively remove portions of the film (e.g., the top and bottom) while leaving other portions of the film (e.g., the sidewall) as a spacer. Some embodiments of the disclosure are advantageously performed in a single processing chamber.

While the various embodiments of the disclosure are described with respect to the deposition of silicon nitride films, those skilled in the art will understand that the disclosure is not so limited. Other films can be deposited, treated and etched to leave a spacer.

In some embodiments, the silicon nitride selective deposition includes two processes in a single processing chamber: SiN film deposition and plasma treatment. A batch processing chamber can be used to process a spatial atomic layer deposition (ALD) sequence: silicon precursor exposure; nitrogen precursor exposure (thermal or plasma); RF plasma treatment with, for example, $N_2$, $NH_3$, $H_2$ or $O_2$ gases (which can be mixed with inert gases such as Ar or He). The silicon and nitrogen precursors forming a conformal SiN film and the plasma treatment modifying the film on the top and bottom of the feature. In some embodiments, the RF plasma treatment uses a hardware configured to have a directional treatment effect on the film. The plasma treatment process could form either N—H or Si—O bonds on the film surface and penetrate into the film a depth based on the treatment time and RF power. This has been found to produce higher wet etch rates on the top and bottom of the feature. The deposition layer thickness and plasma treatment level can be adjusted to increase the wet etch rate selectivity. Selective deposition in some embodiments is performed at wafer temperatures in the range of about 200° C. to about 550° C. One or more embodiments advantageously provide films in which a directional dry etch method is optional, such as physical bombardment, because the as deposited film shows different film properties at the top/bottom than the sidewalls of the features and a conformal dry etching can selectively remove the top/bottom of the film.

Referring to FIGS. 6A through 6E, one or more embodiments of the disclosure are directed to processing methods to deposit a spacer film on a substrate surface 300 having a feature 310 thereon. The feature 310 can be any three-dimensional structure that a film can be deposited on. The feature 310 shown in the Figures is a mandrel; however, those skilled in the art will understand that this is merely representative of one possible structure. Suitable features 310 include, but are not limited to, ridges, trenches and vias.

The feature 310 includes a top 320, a bottom 330 and a sidewall 340. In the embodiment shown, the feature 310 has two sidewalls 340 on either side of the feature 310. The feature 310 has a height defined by the top 320 and bottom 330 and a width defined by the distance between the sidewalls 340.

The substrate surface 300 is provided with the at least one feature 310 thereon. As used in this specification and the appended claims, the term "provided" used in this manner means that the substrate surface 300 is placed or positioned in an environment for processing.

Figure 6A:
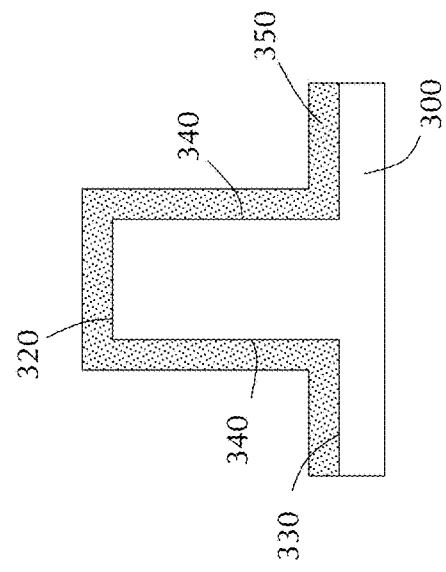
FIGS. 6A through 6E show a processing method in accordance with one or more embodiment of the disclosure.
Figure 6B:
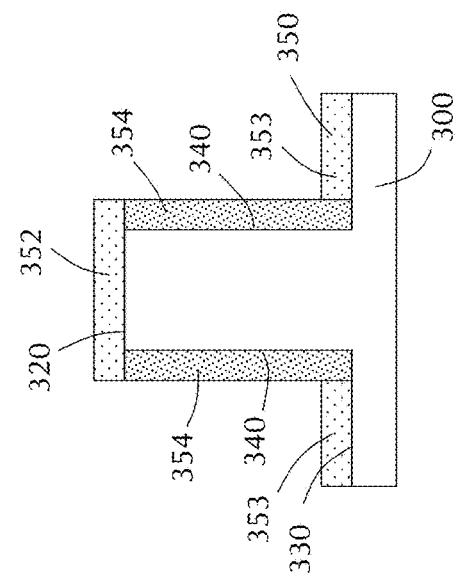

As shown in FIG. 6B, a film 350 is formed on the substrate surface 300 so that the film forms on the at least one feature 310. The film 350 forms on the top 320, bottom 330 and sidewalls 340 of the feature 310. In some embodiments, the film 350 forms conformally on the feature 310. As used herein, the term "conformal", or "conformally", refers to a layer that adheres to and uniformly covers exposed surfaces with a thickness having a variation of less than 1% relative to the average thickness of the film. For example, a 1,000 Å thick film would have less than a 10 Å variation in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

In some embodiments, the film 350 comprises SiN. The formation of the SiN can be performed by any suitable method including, but not limited to, atomic layer deposition (ALD), plasma-enhanced atomic layer deposition (PEALD), chemical vapor deposition (CVD) and plasma-enhanced chemical vapor deposition (PECVD). In some embodiments, the film 350 is SiN formed by and ALD process in which the substrate surface 300 is sequentially exposed to a silicon precursor and a nitrogen reactant. As used in this regard, a "silicon precursor" reacts with the surface of the substrate so that silicon molecules remain on the substrate surface. As used in this regard, a "nitrogen reactant" reacts with the silicon molecules on the substrate surface.

In some embodiments, the SiN film is formed on the substrate surface 300 with exposure to a nitrogen precursor between the exposure to the silicon precursor and the nitrogen reactant. As used in this regard, a "nitrogen precursor" reacts with the substrate surface and minimally reacts with the silicon species already on the substrate surface. Stated differently, the nitrogen precursor comprises a species that does not react with silicon precursor molecules on the substrate surface. The exposure to the nitrogen precursor can occur before, during or after exposure to the silicon precursor as both the nitrogen precursor species and the silicon precursor species are reactive with the substrate surface and are minimally reactive with each other.

Suitable silicon precursors include, but are not limited to, silane, disilane, dichlorisilane (DCS), bis(diethylamino)silane (BDEAS), tetrakis(dimethylamino)silane (TDMAS) and/or bis(tertiary-butylamino)silane (BTBAS). In some embodiments, the silicon precursor comprises dichlorosilane. In one or more embodiments, the silicon precursor consists essentially of dichlorosilane meaning that there is less than 1% on an atomic basis of silicon species other than dichlorosilane.

Suitable nitrogen precursors include, but are not limited to, molecular nitrogen and ammonia. The process conditions employed during nitrogen precursor exposure can affect the reactivity of the nitrogen species with the silicon species on the surface. In some embodiments, the process conditions are configured such that the nitrogen precursor reacts substantially only with the substrate surface. As used in this regard, the term "substantially only" means that the nitrogen precursor reacts with less than about 10% of the surface silicon species.

The nitrogen reactant is a species that forms the silicon nitride film on the substrate surface. In some embodiments, the nitrogen reactant provides the nitrogen atoms for the formation of the nitride film (e.g., SiN). In one or more embodiments, the nitrogen reactant does not include a nitrogen-containing species and forms the nitride film by facilitating a reaction between surface species. Suitable nitrogen reactants include, but are not limited to, nitrogen plasma, ammonia plasma, a plasma comprising a mixture of two or more of hydrogen, nitrogen, ammonia, helium, argon or oxygen. In some embodiments, the nitrogen reactant comprises a plasma of argon and ammonia, or a plasma of argon and nitrogen, or a plasma of argon and oxygen, or a plasma of helium and ammonia. In some embodiments, the nitrogen reactant comprises a plasma without nitrogen that reacts with the nitrogen species on the surface. In some embodiments, the nitrogen reactant comprises a plasma of hydrogen and argon, or a plasma of hydrogen and nitrogen, or a plasma of hydrogen and helium, or a plasma of hydrogen and ammonia, or a plasma of hydrogen and oxygen.

Figure 6C:
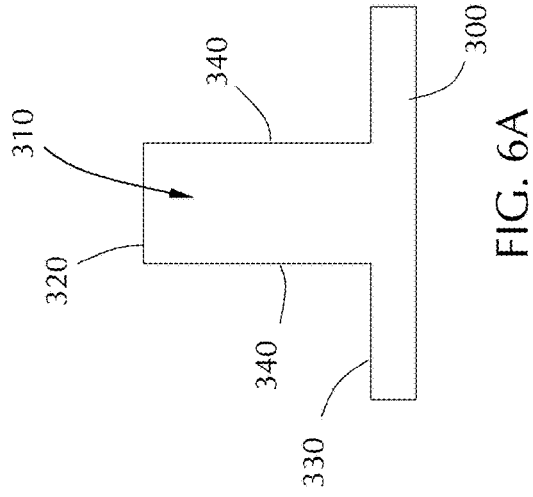

As shown in FIG. 6C, after formation of the film 350 (e.g., silicon nitride), the film 350 is treated with a plasma 360 having a high ion concentration. The plasma 360 can be a directional plasma. As used in this specification and the appended claims, the term "directional plasma" means that the energetic species present in the plasma (ions and radicals) move in a specified direction. For example, in FIG. 6C, the plasma 360 is illustrated moving downward so that the energetic species are able to contact the film 350 on the top surface 320 and bottom surface 330 but have minimal contact with the film 350 on the sidewalls 340.

A plasma with a high ion concentration has a concentration greater than or equal to about $10^{10}/cm^3$. In one or more embodiments, the plasma with the high ion concentration has a concentration greater than or equal to about $10^9/cm^3$, $10^{11}/cm^3$, $10^{12}/cm^3$, $10^{13}/cm^3$ or $10^{14}/cm^3$.

A directional plasma can be formed as a remote plasma in which the plasma species are excited remotely from the substrate surface and flow toward the substrate surface. The substrate and substrate support may not be part of the electrical path used to generate the plasma. A directional plasma may also be formed as a direct plasma in which the substrate or substrate support serve as an electrode in the plasma formation. A direct plasma is generally a diffuse plasma and can be made directional by applying a bias to the substrate so that the ions are attracted to and move toward the substrate.

Figure 6D:
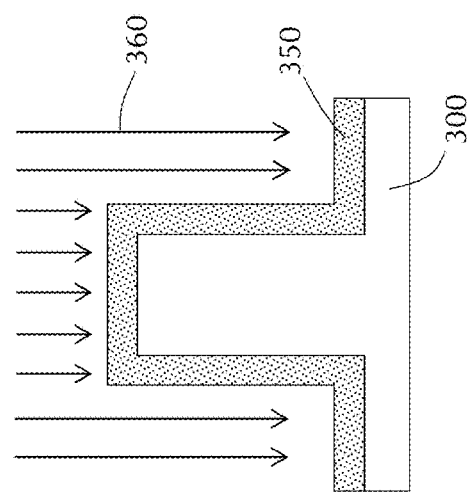

As shown in FIG. 6D, treating the film 350 with the plasma having a high ion concentration modifies a property of the film 350 at the top 320 and bottom 330. In some embodiments, the property of the film 350 that is changed to form the modified top film 352 and modified bottom film 353 affects the wet etch rate in dilute HF (1%) so that the modified top film 352 and modified bottom film 353 can be etched from the feature 310 without substantially affecting the sidewall film 354. In some embodiments, the treatment damages the film 350 on the top and bottom of the feature 310 so that the film can be selectively etched relative to the sidewall.

In some embodiments, the wet etch rate of the modified top film 352 and modified bottom film 353 is greater than or equal to about 15 Å/min. In some embodiments, the wet etch rate of the modified top film 352 and modified bottom film 353 is greater than or equal to about 20 Å/min or 25 Å/min. In some embodiments, the wet etch rate of the modified top film 352 and modified bottom film 353 is greater than 2 times the wet etch rate of the sidewall film 354, or greater than 3, 4, 5, 6, 7, 8, 9, 10, 11, 12, 13, 14, 15 times.

The plasma used in the treatment can be any suitable plasma (e.g., direct or remote) which is capable of modifying the film properties. In some embodiments, the treatment comprises one or more of hydrogen, argon, nitrogen, ammonia, oxygen or helium.

The amount of time used for treatment may affect the amount of damage caused to the film on the top and bottom of the feature. The plasma species and power may affect the depth of the damage caused to the film. A treatment process that causes deeper damage to the film can be repeated less often than a treatment process that causes shallower damage to the film. For example, a $He/NH_3$ plasma may cause deeper damage than an $Ar/NH_3$ plasma so that the film deposited can be thicker before treating with the $He/NH_3$ plasma.

The formation and treatment of the film 350 can be repeated until a film with a predetermined total thickness has been formed. Each step in the film formation process can be sequentially repeated to form a film for treatment. The film can then be treated and the process repeated. In some embodiments, treating the film 350 with the plasma 360 occurs after a film having a thickness in the range of about 1 Å to about 50 Å is deposited. Stated differently, the film 350 is treated after about 1 Å to about 50 Å has been deposited.

Figure 6E:
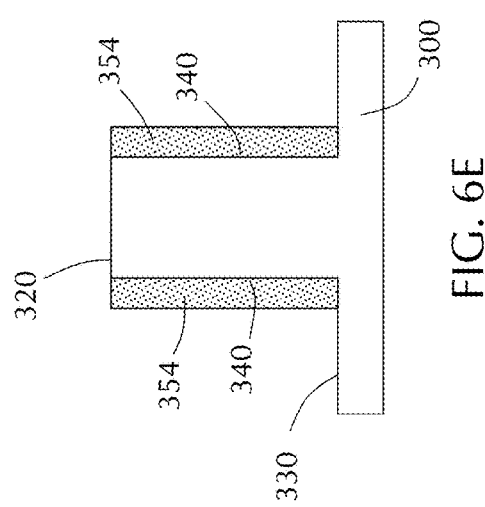

In some embodiments of the method, the film 350 is etched. The modified top film 352 and modified bottom film 353 are selectively etched relative to the sidewall film 354. As used in this regard, selectively etching means that the amount, rate, or degree of etching on the top and bottom is greater than the etching on the sidewall. In some embodiments, the film is etched with dilute HF to selectively remove the film from the top and bottom of the feature. FIG. 6E shows the result of an etch process. While the drawing shows square corners for the top and bottom of the feature 310 and the sidewall film 354, those skilled in the art will understand that this is merely illustrative and that the edges and corners are not perfectly straight or square.

Some embodiments of the disclosure are directed to processes of depositing a spacer material using a batch processing chamber, also referred to as a spatial processing chamber. FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. In a binary reaction, the plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the process region through the purge gas P channel(s). A substrate moving from one end of the gas distribution assembly to the other end will be exposed to each of the process gases in turn, forming a layer on the substrate surface.

Figure 2:
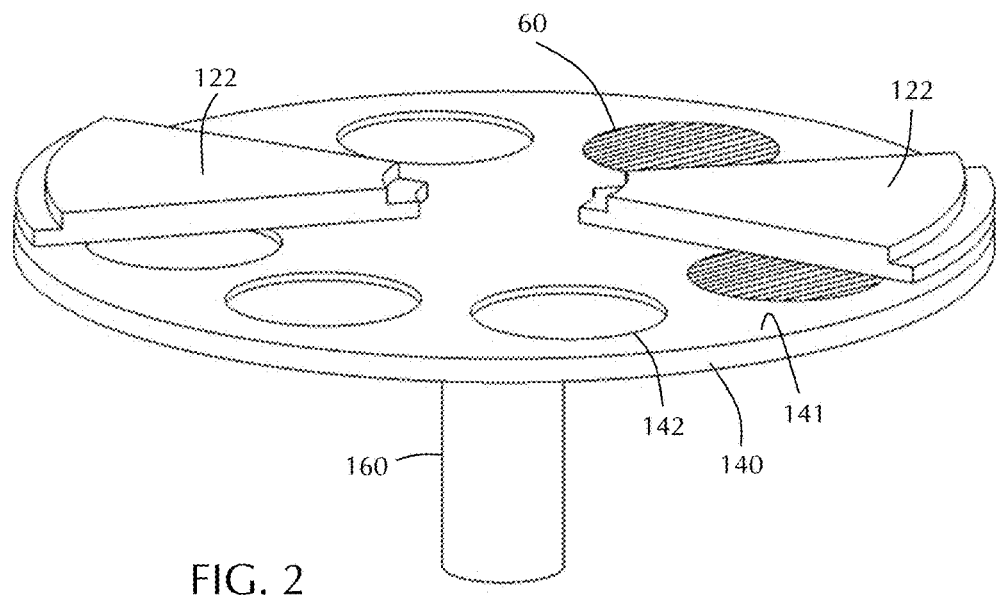
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

A susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
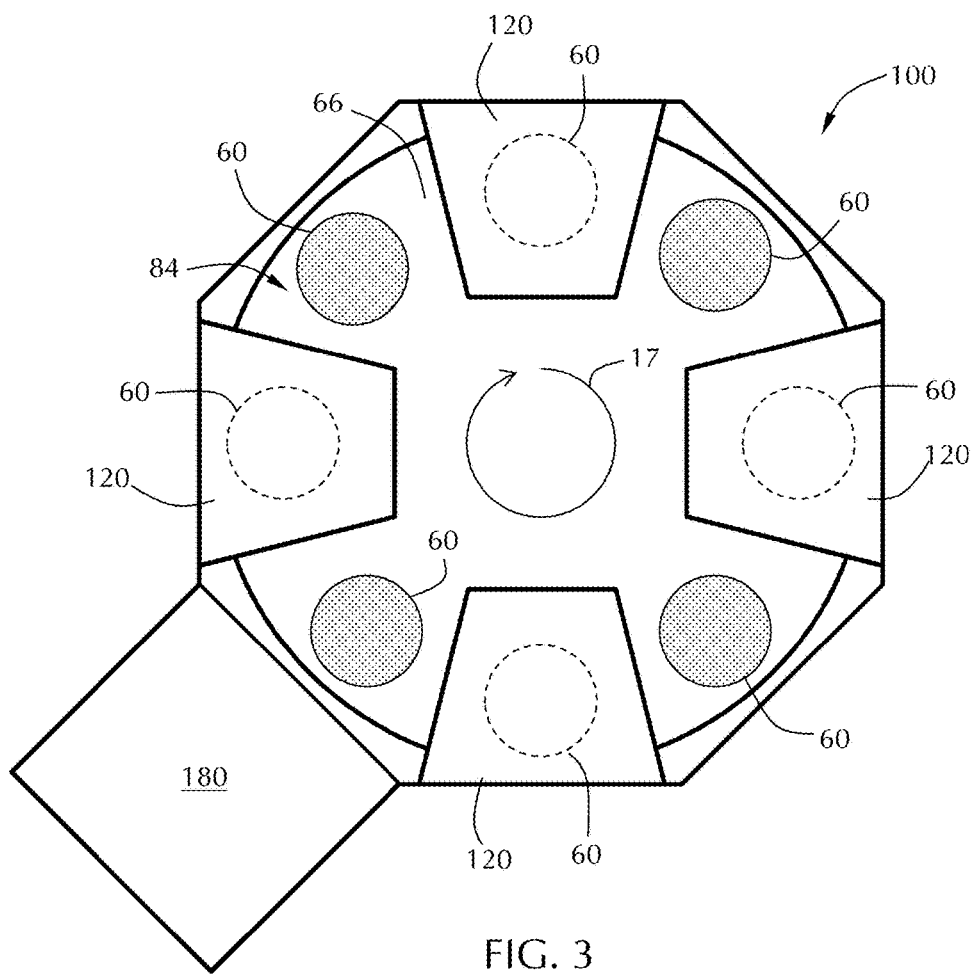
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. The number of substrates 60 and gas distribution assemblies 120 can be the same or different. In some embodiments, there are the same numbers of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one. In an exemplary embodiment, the gas distribution assembly 120 includes eight process regions separated by gas curtains and the susceptor assembly 140 can hold six wafers.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal; however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or intermittent (discontinuous). In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
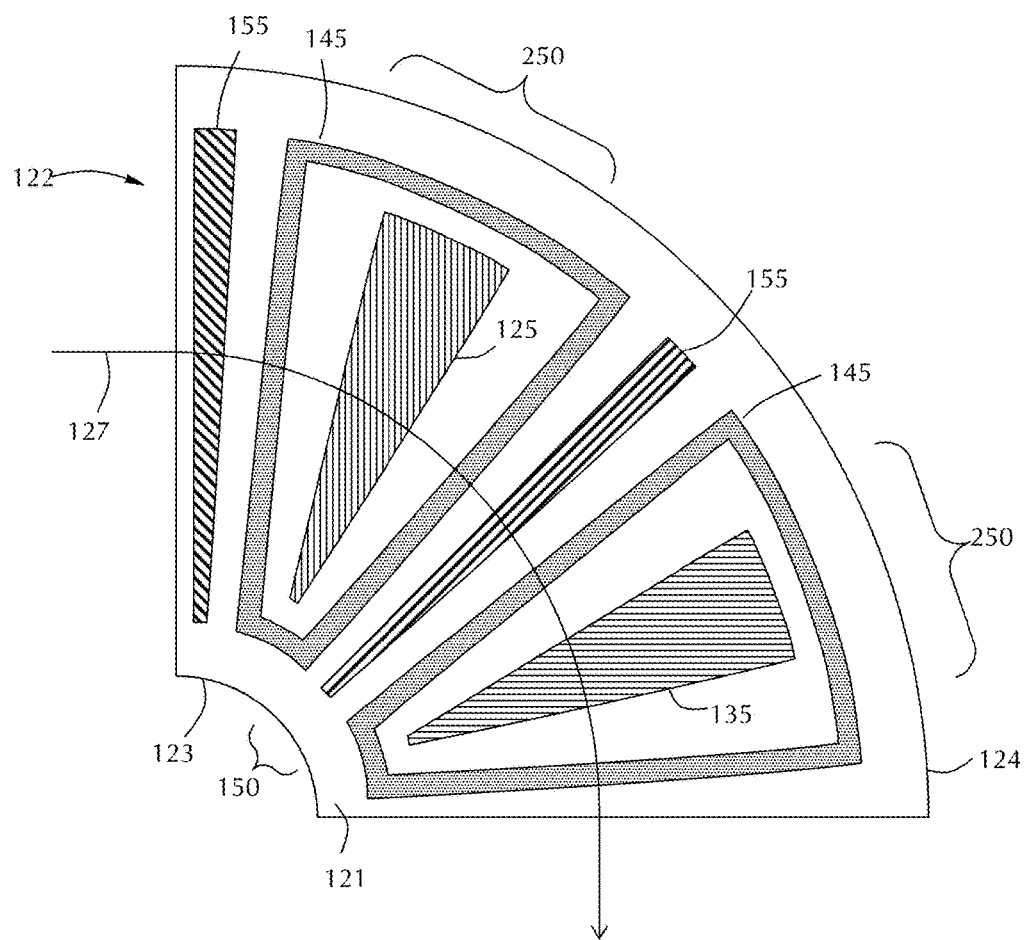
FIG. 4 shows a schematic view of a portion of a wedge shaped gas distribution assembly for use in a batch processing chamber in accordance with one or more embodiment of the disclosure.
Figure 5:
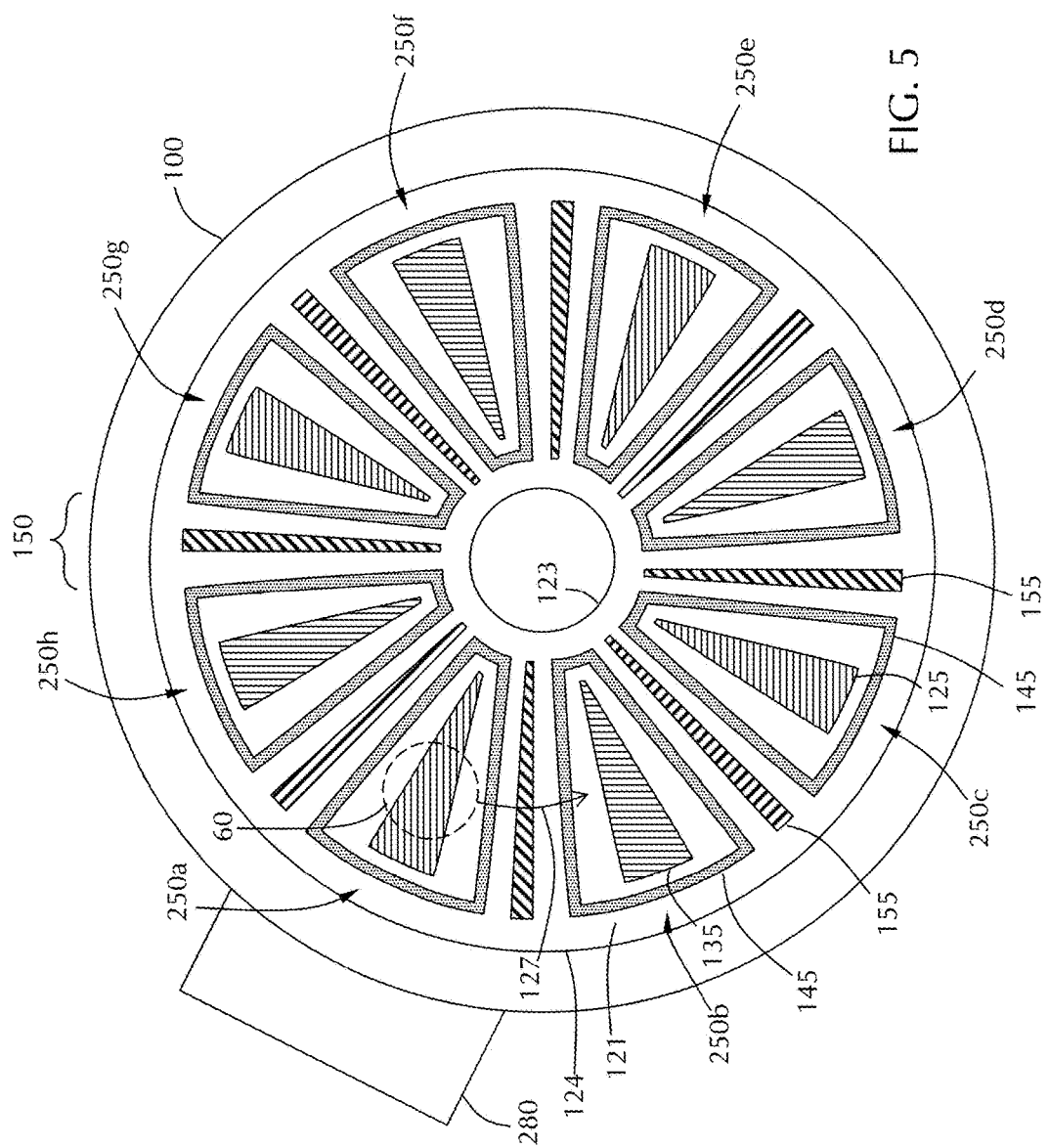
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145, 155 extend from an area adjacent the inner peripheral edge 123 toward an area adjacent the outer peripheral edge 124 of the gas distribution assembly 220. The plurality of gas ports shown include a first reactive gas port 125, a second gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second gas port 135 and a vacuum port 145. Thus, at the end of the path 127 shown in FIG. 4, the substrate has been exposed to the first reactive gas 125 and the second reactive gas 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of process regions 250. The process regions are roughly defined around the individual gas ports 125, 135 with the gas curtain 150 between 250. The embodiment shown in FIG. 5 makes up eight separate process regions 250 with eight separate gas curtains 150 between. A processing chamber can have at least two process region. In some embodiments, there are at least three, four, five, six, seven, eight, nine, 10, 11 or 12 process regions.

During processing a substrate may be exposed to more than one process region 250 at any given time. However, the portions that are exposed to the different process regions will have a gas curtain separating the two. For example, if the leading edge of a substrate enters a process region including the second gas port 135, a middle portion of the substrate will be under a gas curtain 150 and the trailing edge of the substrate will be in a process region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution plate 120. The substrate 60 is loaded via the factory interface 280 into the processing chamber 100 onto a substrate support or susceptor assembly (see FIG. 3). The substrate 60 can be shown positioned within a process region because the substrate is located adjacent the first reactive gas port 125 and between two gas curtains 150a, 150b. Rotating the substrate 60 along path 127 will move the substrate counter-clockwise around the processing chamber 100. Thus, the substrate 60 will be exposed to the first process region 250a through the eighth process region 250h, including all process regions between.

Embodiments of the disclosure are directed to processing methods comprising a processing chamber 100 with a plurality of process regions 250a-250h with each process region separated from an adjacent region by a gas curtain 150. For example, the processing chamber shown in FIG. 5. The number of gas curtains and process regions within the processing chamber can be any suitable number depending on the arrangement of gas flows. The embodiment shown in FIG. 5 has eight gas curtains 150 and eight process regions 250a-250h.

A plurality of substrates 60 are positioned on a substrate support, for example, the susceptor assembly 140 shown FIGS. 1 and 2. The plurality of substrates 60 are rotated around the process regions for processing. Generally, the gas curtains 150 are engaged (gas flowing and vacuum on) throughout processing including periods when no reactive gas is flowing into the chamber.

Accordingly, one or more embodiments of the disclosure are directed to processing methods utilizing a batch processing chamber like that shown in FIG. 5. A substrate 60 is placed into the processing chamber which has a plurality of sections 250, each section separated from adjacent section by a gas curtain 150.

Some embodiments of the method comprise exposing a substrate surface having a feature thereon to a deposition environment to deposit a film. As used in this regard, a "deposition environment" comprises one or more process regions or process conditions that individually or sequentially deposit a film.

In an exemplary process, at least a portion of the substrate surface is exposed to a first process condition in a first section 250a of the processing chamber. The first process condition of some embodiments comprises a silicon precursor to form a silicon film. In one or more embodiments, the first process condition comprises dichlorosilane.

The substrate surface is laterally moved through a gas curtain 150 to a second section 250b. The silicon layer is exposed to a second process condition in the second section 250b. The second process condition of some embodiments comprises a nitrogen precursor to form a nitrogen film. In one or more embodiments, the second process condition comprises ammonia.

The substrate surface is laterally moved from the second process region to a third section 250c. The third section 250c of some embodiments comprises a third process condition comprising a reactant to form a film on the top, bottom and sidewalls of the feature. The fourth section 250d may comprise an inert environment. In some embodiments, the third section 250c comprises an inert environment so that there is substantially no surface reaction and the fourth section 250d comprises the third process condition. In one or more embodiments, the third process condition comprises a $N_2$/Ar plasma.

The exposure to the first process condition, the second process condition and the third process condition can be repeated to form a film with a predetermined thickness. For example, referring to FIG. 5, the first section 250a and fifth section 250e may comprise the first process condition; the second section 250b and sixth section 250f may comprise the second process condition; the third section 250c and seventh section 250g may comprise an inert environment; and the fourth section 250d and eighth section 250h may comprise the third process condition. In this arrangement, each rotation of the substrate forms two layers. Those skilled in the art will understand that the use of ordinals such as "first" and "second" to describe process regions do not imply a specific location within the processing chamber, or order of exposure within the processing chamber.

Once a layer of a predetermined thickness has been formed, the first process condition, second process condition and third process condition may be changed to inert environments. The inert environment in the third section 250c, for example, can be changed to a treatment environment comprising a high ion concentration plasma that selectively decreases the wet etch rate of the silicon nitride film on the top and bottom of the feature. For example, the high ion concentration plasma may comprise $He/NH_3$. After exposure to the treatment environment, the individual sections of the processing chamber can be changed back to the previous settings or the process can be stopped.

Figure 7:
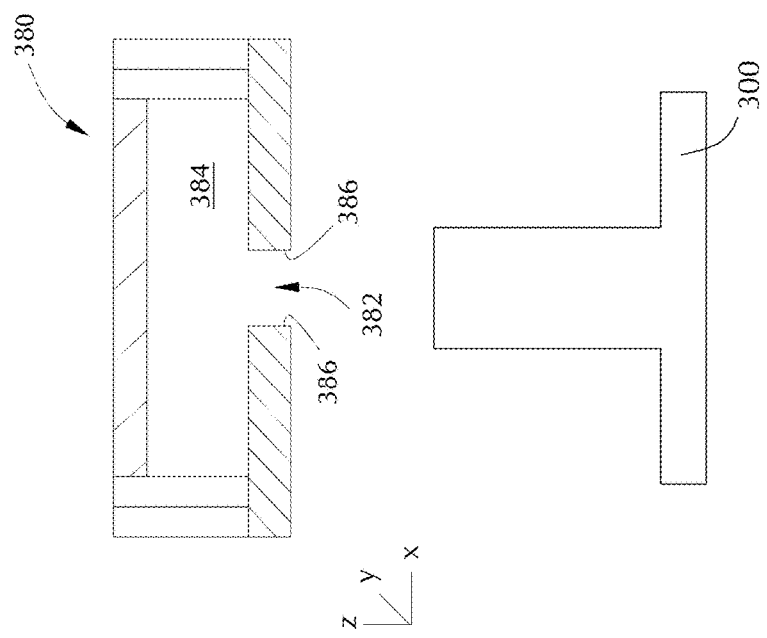
FIG. 7 shows a schematic view of a cross-section of a plasma assembly with a slot in accordance with one or more embodiment of the disclosure.

Referring to FIG. 7, some embodiments use a plasma assembly 380 with a slot 382. The plasma forms in the plasma cavity 384 and flows through the slot 382 toward the substrate surface 300. The view shown in FIG. 7 is a cross-sectional view in which the slot 382 extends out of the page. The slot 382 through which the plasma formed in plasma cavity 384 flows has edges 386. In some embodiments, the plasma has a high ion energy and concentration adjacent the edges 386 of the slot 382.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, annealing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, anneal, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate is moved relative to the gas distribution plate, or vice-versa.

In embodiments, where one or more of the parts of the methods takes place in one chamber, the process may be a spatial ALD process. Although one or more of the chemistries described above may not be compatible (i.e., result in reaction other than on the substrate surface and/or deposit on the chamber), spatial separation ensures that the reagents are not exposed to each in the gas phase. For example, temporal ALD involves the purging the deposition chamber. However, in practice it is sometimes not possible to purge the excess reagent out of the chamber before flowing in additional regent. Therefore, any leftover reagent in the chamber may react. With spatial separation, excess reagent does not need to be purged, and cross-contamination is limited. Furthermore, a lot of time can be used to purge a chamber, and therefore throughput can be increased by eliminating the purge step.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method comprising:
   providing a substrate surface having at least one feature thereon, the at least one feature comprising a top, a bottom and a sidewall;
   forming a film on the at least one feature so that the film is formed on the top, bottom and sidewall; and
   treating the film with a plasma to change a property of the film on the top and bottom of the feature so that the top and bottom of the feature have a wet etch rate that is more than 10 times greater than the film on the sidewall, wherein treating the film comprises exposing the film to a directional plasma having an ion concentration greater than or equal to about $10^{10}/cm^3$.

2. The method of claim 1, further comprising repeatedly forming the film and treating the film sequentially to deposit a film of a total thickness.

3. The method of claim 1, wherein the film comprises SiN.

4. The method of claim 1, wherein the plasma comprises one or more of hydrogen, argon, nitrogen, ammonia, oxygen or helium.

5. The method of claim 1, wherein the directional plasma is a remote plasma formed in a plasma assembly having a slot with edges through which the plasma flows.

6. The method of claim 1, wherein forming the film comprises sequentially exposing the substrate surface to a silicon precursor and a nitrogen reactant to form a silicon nitride film.

7. The method of claim 6, wherein the substrate surface is exposed to a nitrogen precursor between exposure to the silicon precursor and the nitrogen reactant, the nitrogen precursor comprising a species that does not react with silicon precursor molecules on the substrate surface.

8. The method of claim 7, wherein forming the film comprises sequentially exposing the substrate surface to a silicon precursor comprising dichlorosilane, a nitrogen precursor comprising ammonia and a nitrogen reactant comprising a $N_2/Ar$ plasma or a $H_2/Ar$ plasma.

9. The method of claim 7, wherein the plasma comprises ammonia and helium.

10. The method of claim 9, wherein the wet etch rate of the top and bottom of the feature is greater than or equal to about 20 Å/min.

11. The method of claim 1, wherein treating the film occurs after a film having a thickness in the range of about 1 Å to about 50 Å is deposited.

12. The method of claim 1, further comprising etching the film with dilute HF to selectively remove the film from the top and bottom of the feature.

13. A processing method comprising:
    positioning a substrate surface in a processing chamber, the substrate surface having at least one feature thereon, the at least one feature having a top, bottom and sidewalls;
    exposing the substrate surface to a deposition environment comprising at least one deposition cycle, the deposition cycle comprising sequential exposure to a silicon precursor and a nitrogen containing reactant to form a silicon nitride film on the top, bottom and sidewalls of the at least one feature; and
    exposing the silicon nitride film to a treatment environment to modify the silicon nitride film deposited on the top and bottom of the at least one feature so that the film on the top and bottom have a wet etch rate that is more than 10 times greater than the film on the sidewalls, the treatment environment comprising a plasma having an ion concentration greater than or equal to about $10^{10}/cm^3$.

14. The method of claim 13, wherein the deposition cycle further comprises exposing the substrate surface to a nitrogen precursor between the silicon precursor and the nitrogen reactant.

15. The method of claim 14, wherein the silicon precursor comprises dichlorosilane, the nitrogen precursor comprises ammonia and the nitrogen reactant comprises an $N_2/Ar$ plasma or a $H_2/Ar$ plasma.

16. The method of claim 15, wherein the treatment environment comprises an ammonia/helium plasma.

17. The method of claim 13, further comprising selectively etching the silicon nitride film from the top and bottom of the at least one feature.

18. A processing method comprising:
    placing a substrate having a substrate surface with a feature into a processing chamber comprising a plurality of process regions, each process region separated from adjacent process regions by a gas curtain, the feature comprising a top, a bottom and a sidewall;
    exposing at least a portion of the substrate surface to a first process condition in a first process region of the processing chamber, the first process condition comprising a silicon precursor;
    laterally moving the substrate surface through a gas curtain to a second process region of the processing chamber;
    exposing the substrate surface to a second process condition in the second process region of the processing chamber, the second process condition comprising a nitrogen precursor;
    laterally moving the substrate surface through a gas curtain to a third process region of the processing chamber;
    exposing the substrate surface to a third process condition in the third process region of the processing chamber, the third process condition comprising a nitrogen reactant to form a silicon nitride film on the top, bottom and sidewalls of the feature;
    repeating exposure to the first process condition, the second process condition and the third process condition to form a silicon nitride film with a predetermined thickness; and
    moving the substrate surface to a fourth process region of the processing chamber, the fourth process region comprising a treatment environment comprising a plasma having an ion concentration greater than or equal to about $10^{10}/cm^3$ that selectively decreases the wet etch rate of the silicon nitride film on the top and bottom of the feature.

* * * * *